United States Patent
Brody

(10) Patent No.: US 7,531,216 B2
(45) Date of Patent: May 12, 2009

(54) TWO-LAYER SHADOW MASK WITH SMALL DIMENSION APERTURES AND METHOD OF MAKING AND USING SAME

(75) Inventor: Thomas Peter Brody, Pittsburgh, PA (US)

(73) Assignee: Advantech Global, Ltd, Tortola (VG)

( * ) Notice: Subject to any disclaimer, the term of this patent is extended or adjusted under 35 U.S.C. 154(b) by 0 days.

(21) Appl. No.: 10/900,501

(22) Filed: Jul. 28, 2004

(65) Prior Publication Data

US 2006/0024444 A1 Feb. 2, 2006

(51) Int. Cl.
*B05D 1/32* (2006.01)

(52) U.S. Cl. ............... 427/282; 427/248.1; 427/294

(58) Field of Classification Search ............ 427/256, 427/282, 248.1, 255.28
See application file for complete search history.

(56) References Cited

U.S. PATENT DOCUMENTS

| | | | |
|---|---|---|---|
| 3,794,873 A * | 2/1974 | Kaplan et al. ............ 313/402 |
| 4,919,749 A | 4/1990 | Mauger et al. | |
| 5,730,887 A * | 3/1998 | Simpson et al. .......... 216/12 |
| 6,384,529 B2 | 5/2002 | Tang et al. | |
| 6,469,439 B2 * | 10/2002 | Himeshima et al. ...... 313/506 |
| 2002/0011785 A1 | 1/2002 | Tang et al. | |
| 2003/0193285 A1 | 10/2003 | Kim | |

* cited by examiner

*Primary Examiner*—Timothy H Meeks
*Assistant Examiner*—David Turocy
(74) *Attorney, Agent, or Firm*—The Webb Law Firm

(57) ABSTRACT

The present invention is a two-layer shadow mask with small dimension apertures and method of making and using same. The two-layer shadow mask of the present invention is suitable for use for manufacturing an electronic device via deposition in a production system. The two-layer shadow mask of the present invention is formed by a first thick mask, which includes a plurality of apertures that has been formed, for example, by etching, bonded to a second, comparatively thin mask, that has been formed by an electrolytic process, and which includes a plurality of apertures that has been patterned by a photoresist. The second mask is aligned and bonded atop the first mask, with their respective apertures desirably offset one to another. The offset amount of the respective apertures of the two-layer shadow mask determines the resulting final aperture dimension, which may approach 0 microns, through which material is deposited upon a substrate in a deposition production system.

2 Claims, 4 Drawing Sheets

TWO-LAYER SHADOW MASK WITH SMALL DIMENSION APERTURES AND METHOD OF MAKING AND USING SAME

BACKGROUND OF THE INVENTION

1. Field of the Invention

The present invention relates to a shadow mask and, more particularly, to a two-layer shadow mask for forming electronic elements on a substrate.

2. Description of Related Art

Active matrix backplanes are widely used in flat panel displays for routing signals to pixels of the display in order to produce viewable pictures. Presently, active matrix backplanes for flat panel displays are formed by a photolithography manufacturing process, which has been driven in the market by the demand for higher and higher resolution displays, which is not otherwise possible with other manufacturing processes. Photolithography is a pattern definition technique which uses electromagnetic radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse, and dry. As can be seen, the active matrix backplane fabrication process includes numerous deposition and etching steps in order to define appropriate patterns of the backplane.

Because of the number of steps required to form an active matrix backplane with the photolithography manufacturing process, foundries of adequate capacity for volume production of backplanes are very expensive. An exemplary partial list of equipment needed for manufacturing active matrix backplanes includes glass-handling equipment, wet/dry strip equipment, glass-cleaning equipment, wet clean equipment, plasma chemical vapor deposition (CVD) equipment, laser equipment, crystallization equipment, sputtering equipment, ion implant equipment, resist coater equipment, resist stripping equipment, developer equipment, particle inspection equipment, exposure systems, array filet/repair equipment, dry etch systems, anti-electrostatic discharge equipment, wet etch system, and a clean oven. Furthermore, because of the nature of the active matrix backplane fabrication process, the foregoing equipment must be utilized in a class one or class ten clean room. In addition, because of the amount of equipment needed and the size of each piece of equipment, the clean room must have a relatively large area, which can be relatively expensive.

Alternatively, a vapor deposition shadow mask process is well known and has been used for years in microelectronics manufacturing. The vapor deposition shadow mask process is a significantly less costly and less complex manufacturing process, compared to the photolithography process; however, the achievable resolution of, for example, an active matrix backplane formed via shadow mask technology, is limited. Publications disclosing vapor deposition shadow mask processes as well as related processes are disclosed in U.S. Patent Application Publication No. 2003/0193285; U.S. Patent Application Publication No. 2002/0011785; U.S. Pat. Nos. 6,384,529; and 4,919,749.

Presently, shadow mask manufacturing techniques are not favored due to the lack of sufficiently high resolution to meet today's demand for high resolution products, such as active matrix backplanes. As a result, photolithography manufacturing techniques continue to be utilized to produce such high resolution products.

Moreover, the vapor deposition shadow mask process has other certain limitations that are well recognized in the industry. For example, the minimum aperture size that can be produced accurately within a shadow mask is dependent upon several factors, such as the thickness of the shadow mask and the overall area of the shadow mask, as is well known by those skilled in the art. More specifically, the larger the area of the shadow mask, the thicker the shadow mask must be in order to maintain strength and structural integrity during handling and use. However, the thicker the material of the shadow mask, the more difficult it is to achieve highly accurate and small apertures. As a result, the capability to achieve small microelectronics dimensions and, thus, high resolution, by use of the vapor deposition shadow mask process is limited by factors, such as the thickness and overall area of the shadow mask.

Therefore, what is needed, and not disclosed in the art, is a method and apparatus for improving the resolution of a vapor deposition shadow mask process thereby extending its use in manufacturing, especially the manufacturing of high resolution flat panel displays. Still other needs will become apparent to those of ordinary skill in the art upon reading and understanding the following detailed description.

SUMMARY OF THE INVENTION

The invention is a shadow mask that includes a first layer having a first aperture therethrough and a second layer having a second aperture therethrough. The first and second layers are joined together with at least part of the first aperture aligned with at least part of the second aperture to define a third aperture through the first and second layers.

The first and second apertures can either be fully aligned with respect to each other or can be offset with respect to each other. When the first and second layers are aligned, a portion of the first layer can be exposed through the second aperture and/or a portion of the second layer can be exposed through the first aperture.

The first aperture includes a first cavity formed via one side of the first layer and a second cavity formed via the other side of the first layer. At least part of the first cavity and the second cavity can be aligned to define the first aperture.

The first cavity can extend into the first layer a distance substantially therethrough and the second cavity can extend into the first layer a distance less than the first cavity. The convergence of the first and second cavities can define in the first cavity an edge that desirably extends around an interior of the first cavity.

The third aperture can have the shape of a square, a rectangle, a circle or an oval.

The invention is also a method of forming a shadow mask. The method includes defining a first aperture through a first layer and defining a second aperture through a second layer. The first and second layers are co-joined with the first and second apertures at least partially in alignment to define a third aperture through the first and second layers.

The defining of the first aperture can include defining a first cavity in the first layer via one side thereof such that the first cavity extends partially into the first layer and defining a second cavity in the first layer via the other side thereof such that the second cavity joins the first cavity with the first and second cavities at least partially in alignment with each other to define the first aperture. The first cavity can be defined by one or more surfaces in the first layer that converge with increasing distance from the one side of the first layer. The second cavity can be defined by one or more other surfaces in the first layer that converge with increasing distance from the other side of the first layer.

Each cavity can have a square, rectangular, circular or oval shape. A circular or oval cavity includes one continuous surface while a square or rectangular cavity includes four mating surfaces.

The step of defining the second aperture can include depositing a first material on a substrate and defining a first pattern in the first material whereupon at least a portion of the substrate is exposed through the first material. A second material can be deposited on at least the exposed portion of the substrate. The deposited second material can then be separated from the substrate and the first material whereupon the thus separated second material defines the second layer having the second aperture therethrough.

The invention is also a method of shadow mask use for depositing a material on a substrate. The method can include providing a shadow mask having a first layer with a first aperture therethrough and a second layer with a second aperture therethrough. The first and second layers are joined together with at least part of the first aperture aligned with at least part of the second aperture to define a third aperture through the first and second layers. The thus provided shadow mask is positioned in a vacuum vessel between a material deposition source and a substrate. Material from the material deposition source is deposited onto the substrate via the third aperture in the presence of a vacuum in the vacuum vessel.

The step of depositing the material can include depositing the material on a surface of the first aperture and/or a surface of the second layer exposed through first aperture.

The invention is also a shadow mask that includes first and second layers joined together and defining therethrough a deposition aperture that is formed by the at least partial alignment of a first aperture in the first layer and a second aperture in the second layer.

A portion of the first layer can be exposed through the second aperture and/or a portion of the second layer can be exposed through the first aperture.

The first aperture can be defined by first and second cavities in the first layer that are at least partially aligned.

One or more surfaces defining the first cavity can converge with increasing distance into the first layer. One or more surfaces defining the second cavity can converge with increasing distance into the first layer.

An outline of the deposition aperture can have the form of a square, a rectangle, a circle or an oval.

Lastly, the invention is a shadow mask that includes a pair of layers co-joined and defining therethrough a deposition aperture that is formed by the offset alignment of a first aperture in one layer and a second aperture in the other layer.

DETAILED DESCRIPTION OF THE INVENTION

Figures 1A, 1B:
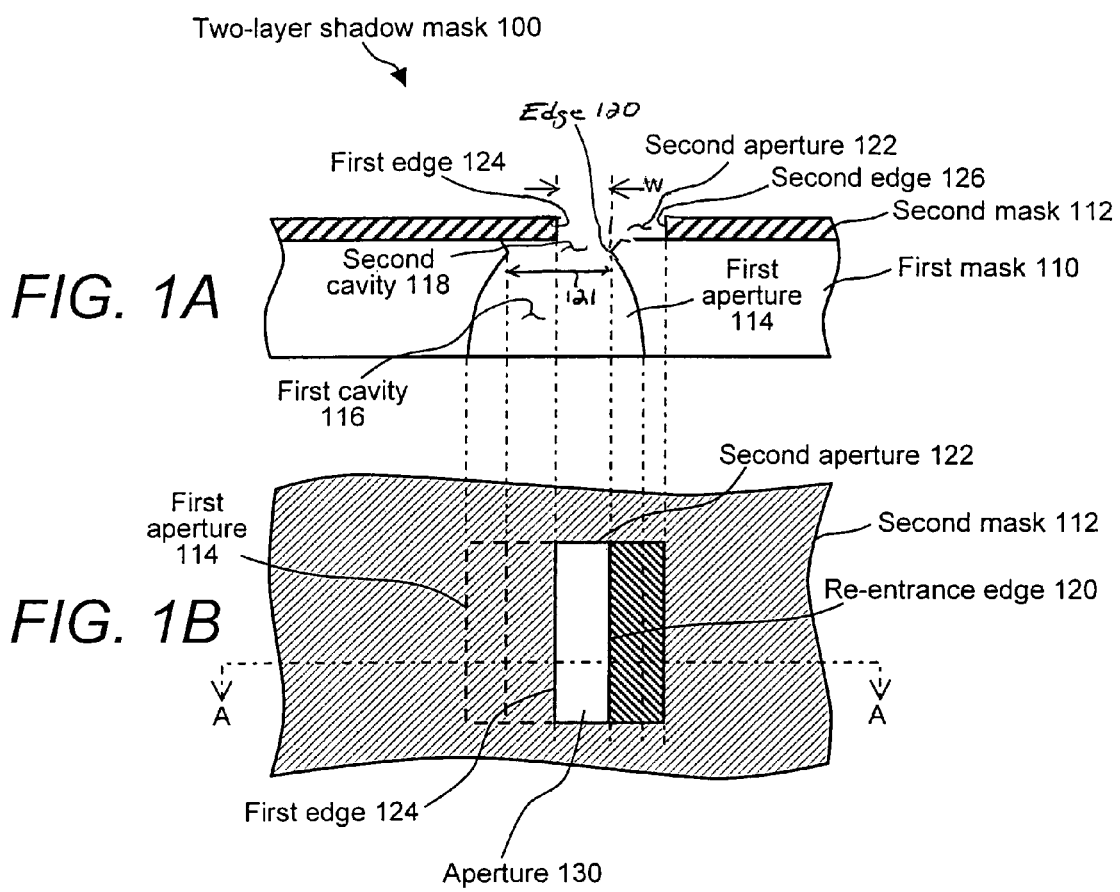
FIG. 1A illustrates a cross-sectional view taken along line A-A of FIG. 1B of a two-layer shadow mask in accordance with the invention.
FIG. 1B illustrates a top view of the two-layer shadow mask of the present invention.

FIG. 1A illustrates a cross-sectional view of a two-layer shadow mask 100 taken along line A-A of FIG. 1B, which is a top view of the same in accordance with the invention. Two-layer shadow mask 100 is suitable for use in a production system, such as a standard vapor deposition process in a vacuum chamber, for manufacturing an electronic device and provides a smaller dimensioned aperture than a conventional single-layer shadow mask.

Two-layer shadow mask 100 includes a first layer or mask 110 formed of, for example, nickel, chromium, steel, or copper, having a thickness of, for example, 150-200 microns. First mask 110 of two-layer shadow mask 100 is bonded to a thinner, second layer or mask 112 that is formed of, for example, nickel via an electroformed nickel process, and that has a minimum thickness of, for example, 10 microns. To form two-layer shadow mask 100, first mask 110 and second mask 112 are joined together by well-known techniques, such as, without limitation, resistance welding or electroform bonding.

First mask 110 includes a first aperture 114 which is formed by defining a first cavity 116 in the side of first mask 110 to be positioned opposite second mask 112 and defining a second cavity 118 in the side of first mask 110 to be positioned adjacent second mask 112. First cavity 116 and second cavity 118 are desirably center aligned one to another to define first aperture 114 which extends through first mask 110. More specifically, first cavity 116 is defined, e.g., etched, in one side of first mask 110 to a depth just short of the full thickness of first mask 110. Second cavity 118, in the form of a shallow hole, is defined, e.g., etched, in the other side of first mask 110. The combination of first cavity 116 and second cavity 118 define first aperture 114.

An edge 120 is defined within first aperture 114 by the intersection of first cavity 116 and second cavity 118. The width of first cavity 116 and the width of second cavity 118 may have fairly coarse dimensions. A width 121 between opposite sides of edge 120 is dependent upon the depth of first cavity 116 and the depth of second cavity 118. Specifically, the deeper the first cavity 116 and the shallower the second cavity 118, the smaller the width 121 of edge 120.

Second mask 112 includes a second aperture 122 having one or more edges, e.g., first edge 124 and second edge 126, which is/are defined therein, desirably by means of a photoresist that has been cured and patterned in the form of negative image pattern upon a sacrificial substrate (not shown). Thereafter, nickel, for example, is deposited, on the cured and patterned photoresist, desirably by an electrolytic process, to approximately the same thickness (height) of the photoresist upon the sacrificial substrate. The photoresist is then dissolved and the sacrificial substrate discarded leaving a desired, positive image pattern, in this case second mask 112 formed from nickel with second aperture 122 formed therein to any desired shape and dimension. This process for forming second mask 112 is known as a "plate-up" pattern definition process. However, those skilled in the art will recognize that other well-known pattern definition processes, such as etching or a "plate-down" process may be used to form second mask 112.

Second mask 112 is then joined, e.g., bonded, to first mask 110 with second aperture 122 of second mask 112 shifted or offset with respect to first aperture 114 of first mask 110. The resulting area where first aperture 114 is in alignment with second aperture 122 defines through two-layer shadow mask 100 an aperture 130 of a desired dimension and geometry through which material can be deposited for forming an element. Aperture 130 shown in FIGS. 1A and 1B is not to be construed as being limited to any particular shape since aperture 130 may be of any desired shape, such as square, rectangular, circular or oval.

The combination of second mask 112 bonded to first mask 110 to form two-layer shadow mask 100 not only provides a means for achieving a small aperture dimension, but also enables two-layer shadow mask 100 to have an overall thickness suitable to maintain strength and structural integrity during handling and use.

Figure 2:
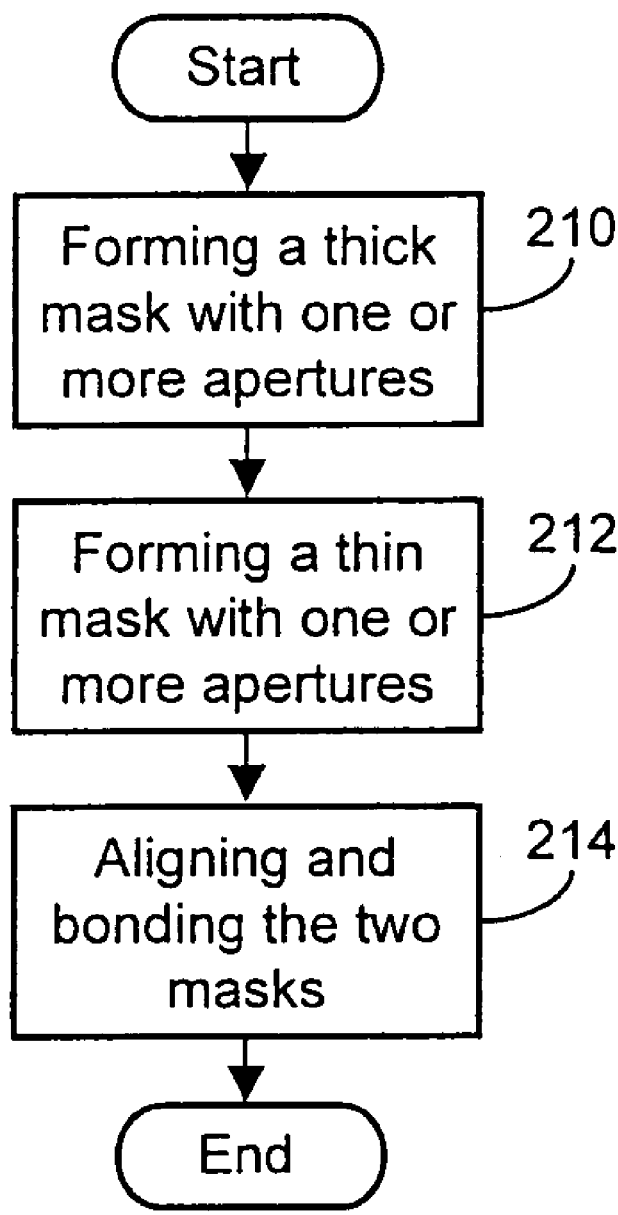
FIG. 2 illustrates a flow diagram of a method of making the two-layer shadow mask of the present invention.

FIG. 2 illustrates a flow diagram of a method 200 of making two-layer shadow mask 100 in accordance with the invention. In step 210, a thick mask, e.g., first mask 110, with one or more apertures, e.g., first aperture 114, is formed of a sheet of, for example, nickel, chromium, steel, or copper. The sheet material has a thickness of, for example, 150-200 microns. Each aperture is formed by, for example, etching a first, deep cavity, e.g., first cavity 116, in one side and a second, shallow cavity, e.g., second cavity 118, in the opposite side of the sheet. Each aperture is formed according to a predetermined size and location according to a specific predetermined pattern.

In step 212, a thin mask, e.g., second mask 112, with one or more apertures, e.g., second aperture 122, is formed of a sheet of, for example, nickel via an electroformed nickel process and has a minimum thickness of, for example, 10 microns. Each aperture can be formed by electrolytically depositing nickel to approximately the same thickness as the cured and patterned photoresist is deposited upon the sacrificial substrate. The photoresist is then dissolved and the sacrificial substrate discarded thereby leaving the nickel layer with one or more apertures formed therein. Each aperture is formed to a predetermined shape, dimension and location according to a specific predetermined pattern.

In step 214, the thin mask formed in step 212 is joined to the thick mask formed in step 210, such that their respective apertures are shifted or offset with respect to one another. For example, and with reference to FIG. 1A, second mask 112 is joined to first mask 110 such that at least a portion of edge 120 of first aperture 114 is aligned between first edge 124 and second edge 126 of second aperture 122. As a result, a portion of second mask 112 is positioned in-line with first aperture 114 and a width "w" of aperture 130 is defined, in this example, by the distance between first edge 124 of second aperture 122 and the portion of edge 120 of first aperture 114 in alignment with second aperture 122. The amount of shift or offset between second mask 112 and first mask 110 and, thus, the width "w" of each aperture 130 is predetermined according to a specific pattern. The width "w" of each aperture 130 may range from the full width of second aperture 122 (i.e., no shift) to approaching 0 microns (i.e., maximum shift). Because the width 121 of edge 120 may be an obstacle to achieving the full width of aperture 130, edge 120 is desirably as sharp as possible, e.g., like a knife edge. However, this is not to be construed as limiting the invention.

Figure 3:
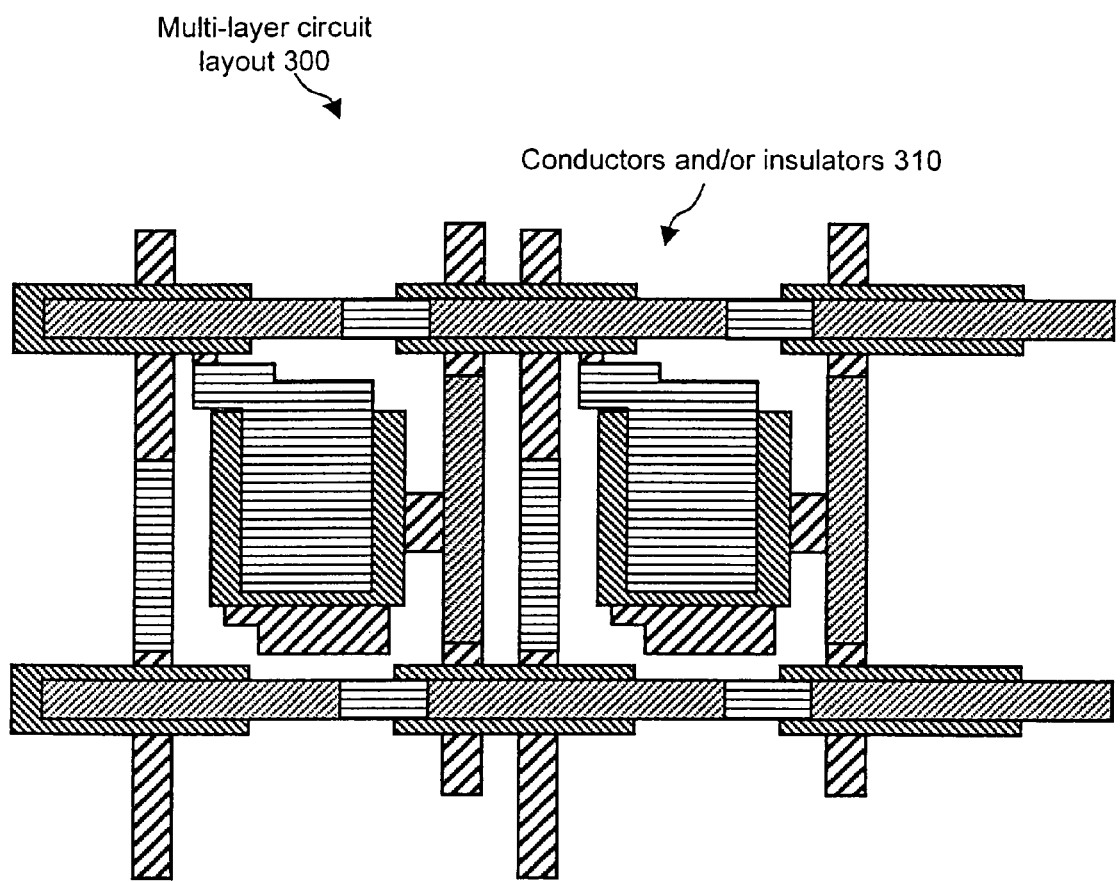
FIG. 3 illustrates an exemplary multi-layer circuit formed utilizing a plurality of two-layer shadow masks of the present invention.

FIG. 3 illustrates an exemplary multi-layer circuit 300, such as an active matrix driver circuit for an organic light-emitting diode (OLED) display that is formed utilizing a plurality of two-layer shadow masks 100 of the present invention. Multi-layer circuit 300 is formed of multiple layers of conductors and/or insulators 310 by the successive deposition of materials on a substrate through two-layer shadow masks 100 positioned in deposition vacuum vessels. Each layer of conductors and/or insulators 310 is deposited by the use of an associated two-layer shadow mask 100 that has a respective pattern of apertures 130.

Figure 4A:
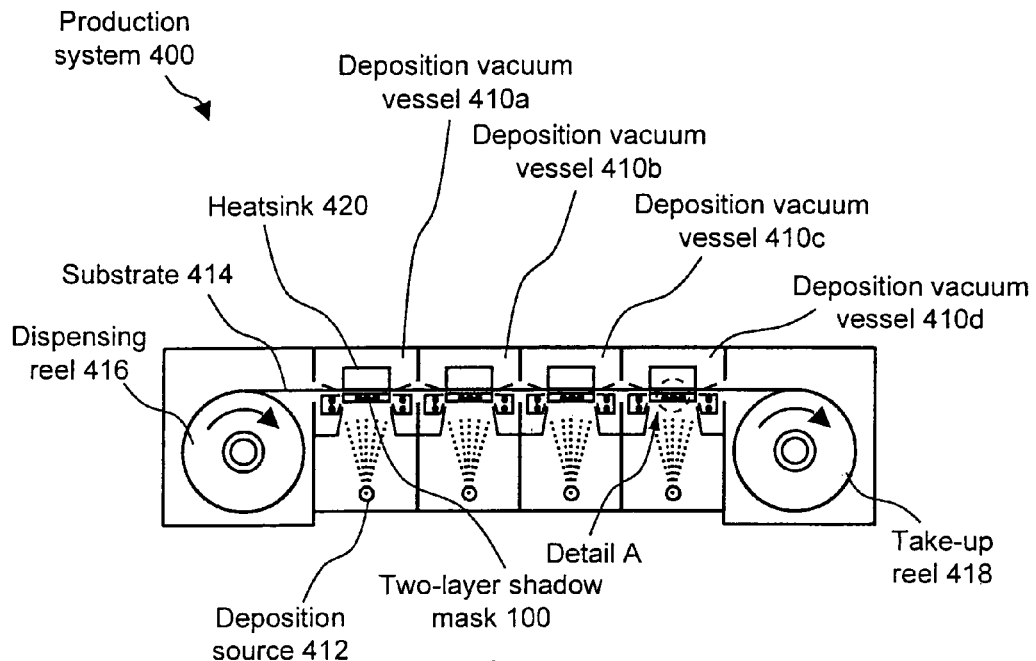
FIG. 4A illustrates an exemplary production system that uses the two-layer shadow mask of the present invention for producing an electronic device.

FIG. 4A illustrates an exemplary production system 400 that uses a plurality of two-layer shadow masks 100 of the present invention for producing an electronic device, such as multi-layer circuit 300 in FIG. 3.

One example of a suitable production system 400 is described in U.S. Patent Application Publication No. 2003/0228715, entitled, "Active matrix backplane for controlling controlled elements and method of manufacture thereof" which is incorporated herein by reference. The '715 publication describes an electronic device formed from electronic elements deposited on a substrate. The electronic elements are deposited on the substrate by the advancement or translation of the substrate through a plurality of deposition vacuum vessels, each of which has at least one material deposition source and a shadow mask, such as two-layer shadow mask 100, positioned therein. The material from at least one material deposition source positioned in each deposition vacuum vessel is deposited on the substrate through the shadow mask that is positioned in the deposition vacuum vessel to form on the substrate a circuit formed of an array of electronic elements. The circuit is formed solely by the successive deposition of materials on the substrate.

Production system 400 includes a plurality of series connected deposition vacuum vessels 410 (i.e., deposition vacuum vessels 410a, 410b, 410c, and 410d). Production system 400 is not to be construed as limiting the invention since the number of deposition vacuum vessels 410 comprising production system 400 is dependent upon the number of deposition events required for any given product formed therewith.

In operation of production system 400, a substrate 414 translates through serially arranged deposition vacuum vessels 410 by use of a reel-to-reel mechanism that includes a dispensing reel 416 and a take-up reel 418. Each deposition vacuum vessel 410 includes at least one deposition source 412, at least one heatsink 420, and at least one two-layer shadow mask 100.

Each deposition source 412 is charged with a desired material to be deposited onto flexible substrate 414 through a two-layer shadow mask 100 which is also positioned in the corresponding deposition vacuum vessel 410. Substrate 414 can be formed of, for example, anodized aluminum, steel foil, glass or plastic.

Each heatsink 420 includes a top plate desirably having a large mass and a flat reference surface that contacts a side of substrate 414 opposite the corresponding deposition source 412 at least during deposition of material on the portion of substrate 414 in the corresponding deposition vacuum vessel 410. Collectively, the heatsinks 420 included in the deposition vacuum vessels 410 comprising production system 400 act as a heat removal means for substrate 414 as it translates through production system 400. Those skilled in the art will appreciate that production system 400 may include additional stages or vacuum vessels (not shown), such as an anneal stage, a test stage, one or more cleaning stages, a cut and mount stage, and the like, as is well known. In addition, the number, purpose and arrangement of deposition vacuum vessels 410 can be modified as needed for depositing one or more materials required for a particular application by one of ordinary skill in the art.

Each two-layer shadow mask 100 includes a pattern of apertures 130, e.g., slots and holes, as described above with reference to FIGS. 1A, 1B, and 2. The pattern of apertures 130 formed in each two-layer shadow mask 100 corresponds to a desired pattern of material to be deposited on substrate 414 from the deposition source(s) 412 in the deposition vacuum vessel 410 in which two-layer shadow mask 100 resides as substrate 414 is translated therethrough.

Deposition vacuum vessels 410 are utilized for depositing materials on substrate 414 in order to form one or more electronic elements on substrate 414. Each electronic element may be, for example, a thin film transistor (TFT), a diode, a memory element or a capacitor. A multi-layer circuit, such as multi-layer circuit 300 of FIG. 3, is formed solely by the successive deposition of materials on substrate 414 via the successive operation of each deposition vacuum vessel 410.

Each deposition vacuum vessel 410 is connected to a source of vacuum (not shown) for establishing a suitable vacuum therein. More specifically, the source of vacuum establishes a suitable vacuum in deposition vacuum vessel 410 in order to enable the charge of desired material positioned in the corresponding deposition source 412 to be deposited on substrate 414 in a manner known in the art, e.g., sputtering or vapor phase deposition, through apertures 130 of two-layer shadow mask 100.

In the following description of exemplary production system 400, substrate 414 will be described as being a continuous flexible sheet, which is initially disposed on a dispensing reel 416 that dispenses substrate 414 into the first deposition vacuum vessel 410. Dispensing reel 416 is positioned in a preload vacuum vessel, which is connected to a source of vacuum (not shown) for establishing a suitable vacuum therein. However, production system 400 can be configured to continuously process a plurality of individual substrates 414. Each deposition vacuum vessel 410 includes supports or guides that avoid the sagging of substrate 414 as it translates through deposition vacuum vessels 410.

In operation of production system 400, the material each deposition source 412 is charged with is deposited on substrate 414 through a two-layer shadow mask 100 in the presence of a suitable vacuum as substrate 414 is advanced through the corresponding deposition vacuum vessel 410, whereupon plural progressive patterns are formed on substrate 414. More specifically, substrate 414 has plural portions that are positioned for a predetermined interval in each deposition vacuum vessel 410. During each predetermined interval, material is deposited from the deposition source 412 onto the portion of substrate 414 positioned in the corresponding deposition vacuum vessel 410. After this predetermined interval, substrate 414 is step advanced, whereupon the plural portions of substrate 414 are advanced to the next deposition vacuum vessel 410 in series for additional processing, as applicable. This step advancement continues until each portion of substrate 414 has passed through all deposition vacuum vessels 410. Thereafter, each portion of substrate 414 exiting deposition vacuum vessel 410 is received on take-up reel 418, which is positioned in a storage vacuum vessel. Alternatively, each portion of substrate 414 exiting the last deposition vacuum vessel 410 is separated from the remainder of substrate 414 by a cutter (not shown).

Figure 4B:
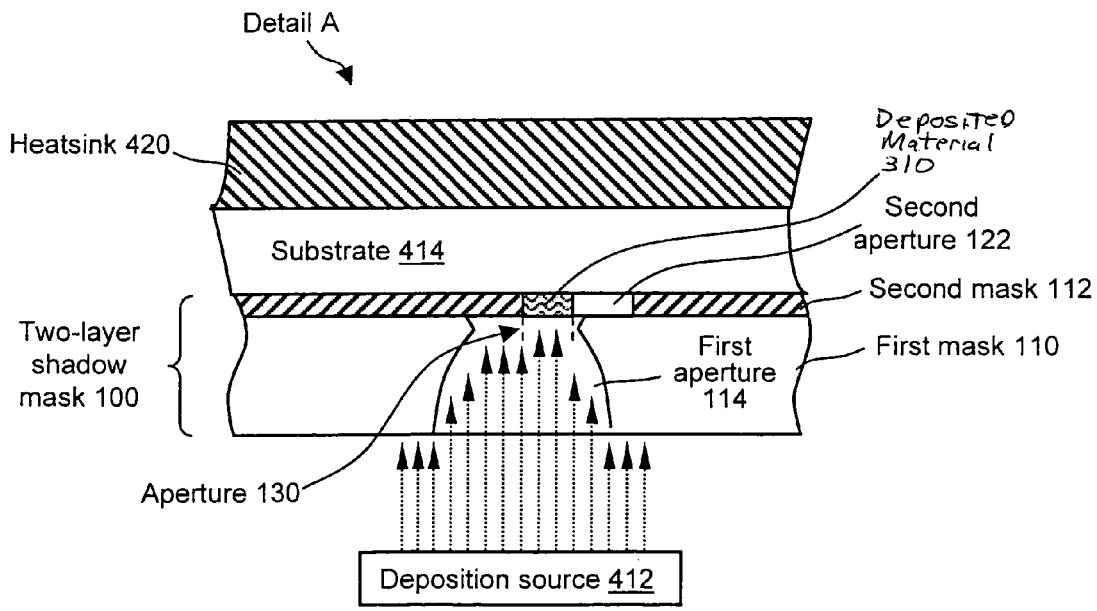
FIG. 4B illustrates an expanded view of Detail A of FIG. 4A.

FIG. 4B illustrates an expanded view of a Detail A of FIG. 4A. FIG. 4B shows the first mask 110 side of two-layer shadow mask 100 oriented toward deposition source 412 and the second mask 112 side of two-layer shadow mask 100 oriented toward substrate 414. FIG. 4B also shows the evaporant material from deposition source 412 entering first aperture 114 of two-layer shadow mask 100 then entering the clearance area of second aperture 122 of second mask 112 along a "line of sight" from deposition source 412 that defines the resulting aperture 130. The thickness of conductors and/or insulator material 310 deposited on substrate 414 via aperture 130 is dependent upon the deposition time and the deposition rate, as is well known.

The use of successive two-layer shadow masks 100 in a production system, each of which includes a pattern of apertures 130 that have dimensions that may approach 0 microns, allows for the overall circuit area to be reduced. In the case of a flat panel display, the result is that more pixels per inch may be deposited and, thus, a higher resolution display is achieved through the use of the two-layer shadow mask 100 of the present invention within the low cost and low complexity shadow mask manufacturing process.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method for deposition a material on a substrate using a shadow mask comprising:
   (a) providing a shadow mask having a first layer (110) with a first aperture (114) therethrough and a second layer (112) with a second aperture (122) therethrough, the first and second layers joined together with the first aperture (114) and the second aperture (122) offset to define a third aperture (130) through the first and second layers (110 and 112), wherein when viewed in a direction normal to the first and second layers (110 and 122), the third aperture (130) is smaller than the first aperture (114) and the third aperture (130) is smaller than the second aperture (122);
   (b) positioning the shadow mask in a vacuum vessel (410) between a material deposition source (412) and a substrate (414); and
   (c) depositing material from the material deposition source (412) onto the substrate (414) via the third aperture (130) in the presence of a vacuum in the vacuum vessel (410).

2. The method of claim 1, wherein step (c) further includes depositing the material on at least one of:
   a surface of the first aperture (114); and
   a surface of the second layer (118) exposed through first aperture (114).

* * * * *

UNITED STATES PATENT AND TRADEMARK OFFICE
CERTIFICATE OF CORRECTION

PATENT NO. : 7,531,216 B2  Page 1 of 1
APPLICATION NO. : 10/900501
DATED : May 12, 2009
INVENTOR(S) : Brody It is certified that error appears in the above-identified patent and that said Letters Patent is hereby corrected as shown below:

Column 8, Line 1 of Claim 1, "deposition a material" should read -- deposition of a material --

Signed and Sealed this

Eighth Day of September, 2009

David J. Kappos
*Director of the United States Patent and Trademark Office*

UNITED STATES PATENT AND TRADEMARK OFFICE
CERTIFICATE OF CORRECTION

PATENT NO. : 7,531,216 B2  Page 1 of 1
APPLICATION NO. : 10/900501
DATED : May 12, 2009
INVENTOR(S) : Brody It is certified that error appears in the above-identified patent and that said Letters Patent is hereby corrected as shown below:

Column 8, Line 31, Claim 1, "deposition a material" should read -- deposition of a material --

This certificate supersedes the Certificate of Correction issued September 8, 2009.

Signed and Sealed this

Twenty-ninth Day of September, 2009

David J. Kappos
*Director of the United States Patent and Trademark Office*